United States Patent [19]

Casper et al.

[11] Patent Number: 5,311,481
[45] Date of Patent: May 10, 1994

[54] WORDLINE DRIVER CIRCUIT HAVING A DIRECTLY GATED PULL-DOWN DEVICE

[75] Inventors: Stephen L. Casper; Adrian Ong; Paul S. Zagar, all of Boise, Id.

[73] Assignee: Micron Technology, Inc., Boise, Id.

[21] Appl. No.: 993,934

[22] Filed: Dec. 17, 1992

[51] Int. Cl.$^5$ .................................................. G11C 8/00
[52] U.S. Cl. ........................... 365/230.06; 365/230.08; 365/230.01; 365/189.01
[58] Field of Search ................ 365/230.06, 230.08, 365/194, 185, 203, 230.01, 189.01, 189.05

[56] References Cited

U.S. PATENT DOCUMENTS

| | | | |
|---|---|---|---|
| 4,962,327 | 10/1990 | Iwazaki | 307/449 |
| 5,054,002 | 10/1991 | Ninomiya et al. | 365/194 |
| 5,065,361 | 11/1991 | Yoshizawa et al. | 365/230.08 |
| 5,202,855 | 4/1993 | Morton | 365/230.06 |

FOREIGN PATENT DOCUMENTS

0020200 1/1987 Japan ........................ 365/230.06

*Primary Examiner*—Eugene R. LaRoche
*Assistant Examiner*—Huan Hoang
*Attorney, Agent, or Firm*—Susan B. Collier

[57] ABSTRACT

The invention is a circuit and method for quickly driving non-selected wordlines to correct potentials. The invention drives the non-selected wordlines to low potentials through a driving device directly gated by a primary select predecode signal generated by decode circuitry. The driving device is electrically interposed between the wordline and a reference node. The invention provides low power operation, and provides reliable wordline selection for circuits having supply potentials less than 5 volts.

2 Claims, 7 Drawing Sheets

WORDLINE DRIVER CIRCUIT HAVING A DIRECTLY GATED PULL-DOWN DEVICE

CROSS-REFERENCE TO RELATED APPLICATIONS

This application is being filed simultaneously with copending application Ser. No. 07/993,929 entitled A WORDLINE DRIVER CIRCUIT HAVING AN AUTOMATIC PRECHARGE CIRCUIT.

TECHNICAL FIELD

This invention relates generally to memory device technologies and more particularly to a circuit and method for driving a wordline to a desired potential.

BACKGROUND OF THE INVENTION

A DRAM consists of an arrangement of individual memory cells. Each memory cell comprises a capacitor capable of holding a charge and a field effect transistor, hereinafter referred to as an access transistor, for accessing the capacitor charge. The charge is referred to as a data bit and can be either a high voltage or a low voltage. Therefore, the memory has two states; often thought of as the true logic state and the complementary logic state. There are two options available in a DRAM memory: a bit of data may be stored in a specific cell in the write mode, or a bit of data may be retrieved from a specific cell in the read mode. The data is transmitted on signal lines, also called digit lines, to and from the Input/Output lines, hereinafter known as I/O lines, through field effect transistors used as switching devices and called decode transistors. For each bit of data stored, its true logic state is available at an I/O line and its complementary logic state is available at a line designated I/O*. For purposes of this discussion, I/O and I/O* lines are often referred to as just I/O lines. Thus, each cell has two digit lines, referred to as digit line pairs.

Typically, the memory cells are arranged in an array and each cell has an address identifying its location in the array. The array comprises a configuration of intersecting rows and columns and a memory cell is associated with each intersection. In order to read from or write to a cell, the particular cell in question must be selected, also called addressed. The address for the selected cell is represented by input signals to a row decoder and to a column decoder. The row decoder activates a wordline in response to the row address. The selected wordline activates the access transistor for each of the memory cells in electrical communication with the selected wordline. Next the column decoder activates a column decoder output in response to the column address. The active column decoder output selects the desired digit line pair. For a read operation the selected wordline activates the access transistors for a given row address, and data is latched to the digit line pairs. The column decoder output selects and activates the decode transistors such that the data is transferred from the selected digit line pair to the I/O lines.

The row decoder comprises decode circuitry for determining which wordline is selected for a desired address and for determining which wordlines are non-selected. The row decoder also comprises driver circuitry for driving the selected and the non-selected wordlines to potentials having active and inactive logic states respectively. The active wordline has a potential capable of activating the access transistors in electrical communication with the active wordline and the inactive wordline has a potential capable of deactivating the access transistors in electrical communication with the non-selected wordlines. For this discussion the selected wordline will have a high potential and the non-selected wordlines will have low potentials.

Typically the decode circuitry comprises a primary decoder and a secondary decoder for generating a primary select signal, $S_1^*$, and at least one secondary select signal, $S_2$, respectively. The asterisk indicates that the signal is active low. The primary and secondary select signals are used as inputs to a driver portion of the row decoder. The driver portion typically comprises an inverter portion and a latch portion. The primary select signal is typically inverted to the wordline by the inverter portion, and the secondary select signal regulates the switching of the primary select signal to the inverter portion. The latch portion latches a nonselected wordline to the inactive logic state.

Figure 1:
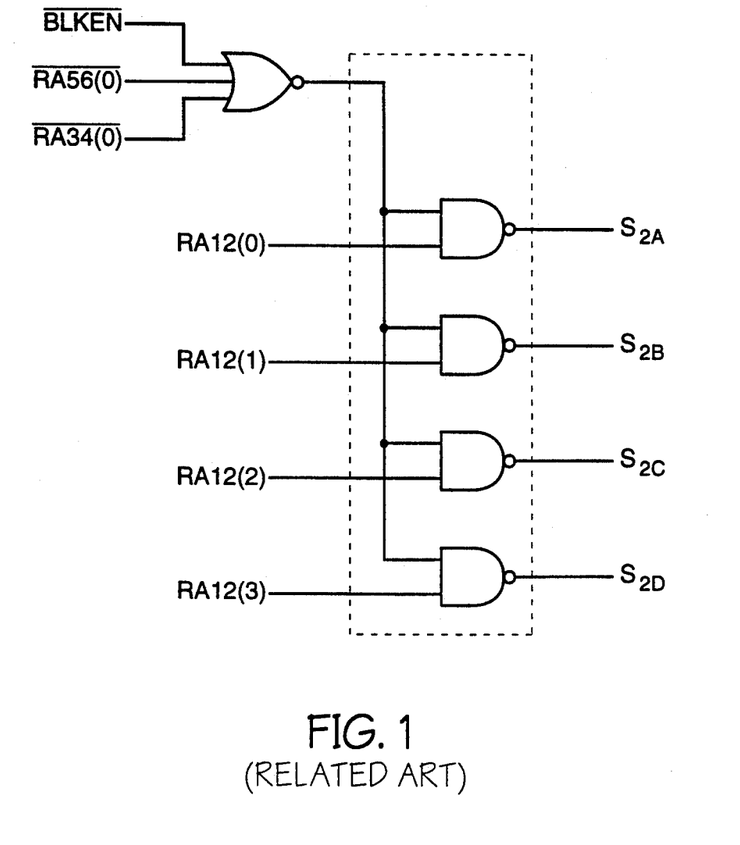
FIG. 1 is a schematic of a portion of a MOS NAND decoder for row decoder circuitry.
Figure 2:
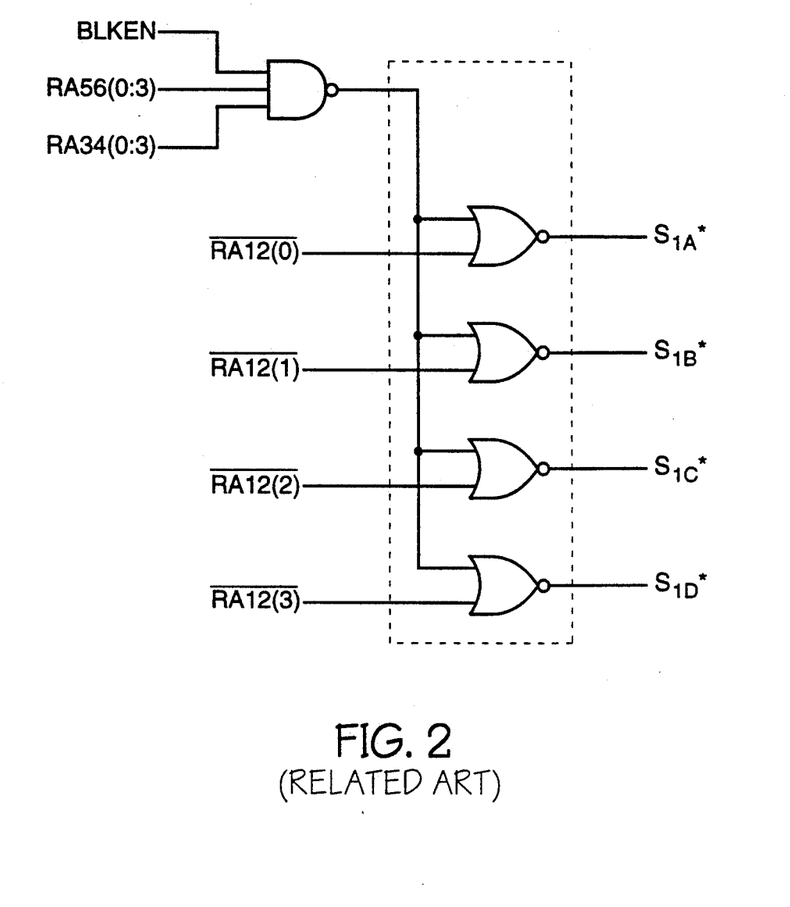
FIG. 2 is a schematic of a portion of a MOS NOR decoder for row decoder circuitry.
Figure 3:
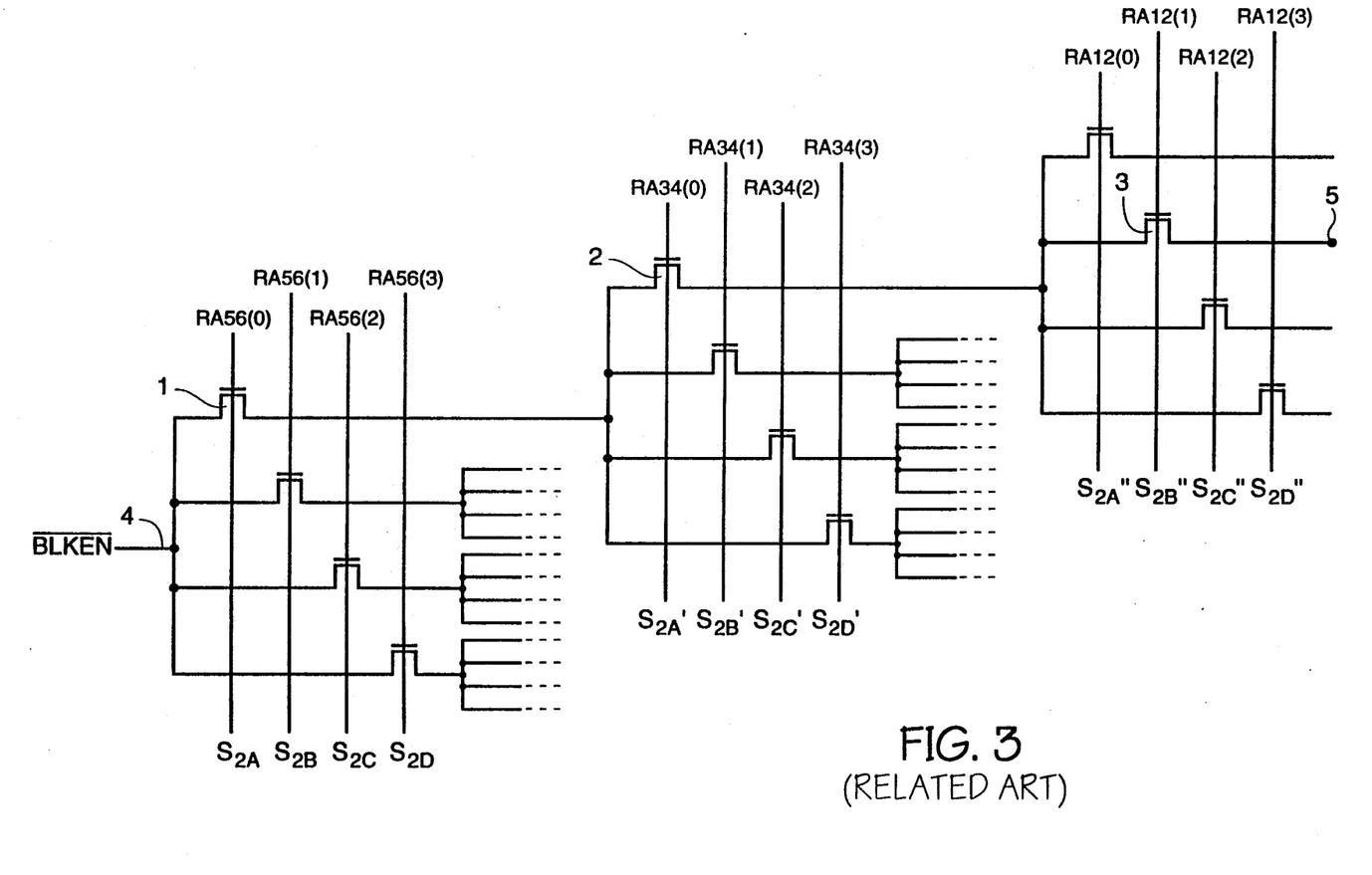
FIG. 3 is a schematic of a portion of a tree decoder for row decoder circuitry.

Typical decoder circuitries can comprise either MOS decodes utilizing NAND circuitry or NOR circuitry, or tree decode circuitry. FIGS. 1, 2 and 3 are examples of a portion of the NAND, NOR, and tree decode circuitries respectively. The decode circuitries of the row decoder provide predecoded addresses to select the driver portion of the row decoder circuit. MOS decode circuitry provides predecode signals comprising the primary select signal, $S_1^*$, and the secondary select signal, $S_2$. Although the specific decode circuitry determining the values of $S_1^*$ and $S_2$ can vary, the variations are well known in the art. FIGS. 1-3 have been included to provide examples of portions of possible decode circuitries. FIG. 1 is an example of a portion of a CMOS NAND decode circuit wherein each of the secondary select signals, $S_{2A}$, $S_{2B}$, $S_{2C}$ and $S_{2D}$, is a one of four decode having four phases, and wherein $S_1^*$ (not shown) comes from a one of 64 CMOS NAND decode used to decode 256 wordlines. FIG. 2 is an example of a portion of a CMOS NOR decode circuit wherein each of the primary select signals, $S_{1A}^*$, $S_{1B}^*$, $S_{1C}^*$ and $S_{1D}^*$, is a one of four decode using four phases, and wherein secondary select signal $S_2$, (not shown), comes from a one of 64 CMOS NOR decode used to decode 256 wordlines.

In the circuits of FIGS. 1 and 2, the secondary select signal controls the activation of a single pass transistor. The decode circuitry may employ the tree decode configuration wherein a plurality of serially connected pass transistors are activated in order to drive the selected wordline to a high logic level. In the example depicted by FIG. 3 predecode address signals activate three serially connected pass transistors. For example if predetermined address signals RA56(0), RA34(0), and RA12(1) are high and the remaining predecode addresses are low, transistors 1,2, and 3 are activated providing an electrical path between points 4 and 5. These decode circuitries are well known to those skilled in the art.

Figure 4:
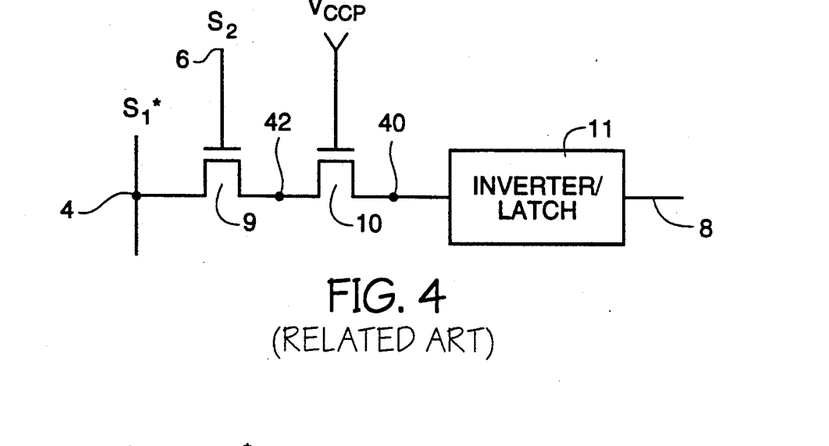
FIG. 4 is a schematic of a driver circuit of a row decoder of the related art.

FIG. 4 is a simplified schematic of the driver circuit of the related art. Each wordline in the array has a similar driver circuit. In FIG. 4, a MOS decode has been utilized to provide a primary select signal $S_1^*$ at primary select node 4 and a secondary select signal $S_2$ at secondary select node 6. The select signals $S_1^*$ and $S_2$ control the potential of the wordline 8. The primary select signal is transmitted through NMOS transistor 9 and continually gated transistor 10 to an inverter/latch portion 11 when the secondary select signal is high. When select signal S$_2$ is high, NMOS transistor 9 activates and the select signal on S$_1$* is inverted to the wordline 8.

Figure 5:
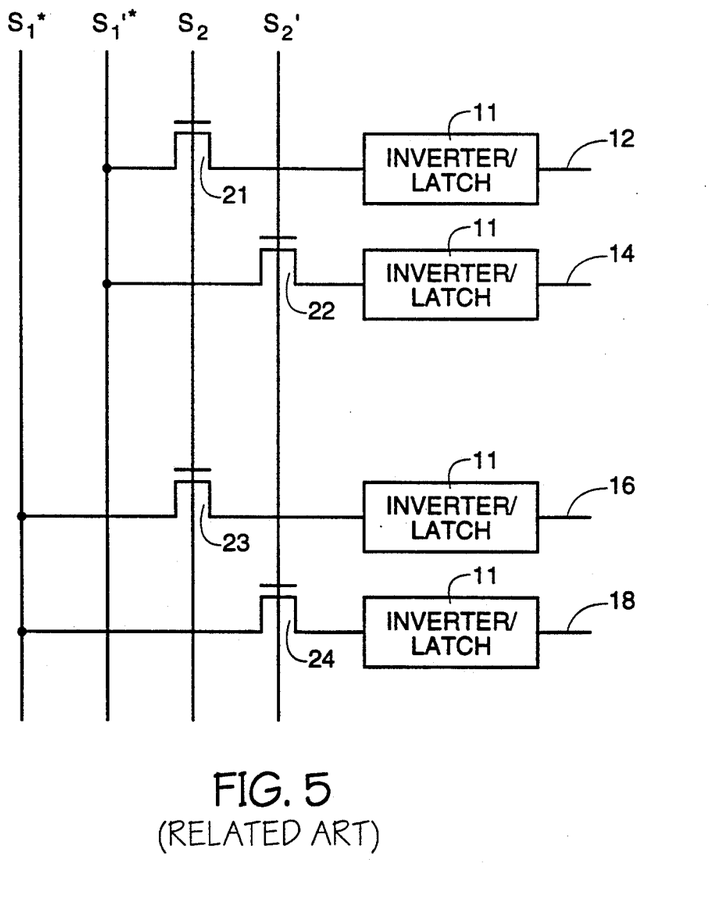
FIG. 5 is a portion of a row decoder circuit for providing a simplified example of wordline selection.

FIG. 5 is a simplified schematic of a portion of the decode circuitry of a typical row decoder of the related art. Primary select signals S$_1$* and S$_1$'* and secondary select signals S$_2$ and S$_2$' are generated by decode circuitry (not shown). The purpose of this discussion is to provide an understanding of the final mechanism for activating and deactivating the wordlines and to provide an understanding of the relationship between the select signals and the driver circuit. At the onset of each read or write cycle, all of the wordlines are typically reset to a low potential. In this case, select signals S$_1$*, S$_1$'*, S$_2$, and S$_2$' have a high potential which take the potentials of the wordlines 12, 14, 16, and 18 low.

During the selection of a wordline the secondary select signals go low except for the secondary select signal which activates the pass transistor in electrical communication with the selected wordline. All of the primary select signals remain high except for the primary select signal which must be inverted to the selected wordline.

Still referring to FIG. 5, assume the desired address selects wordline 14. In this case select signal S$_2$ goes low and select signal S$_2$' is high; and select signal S$_1$'* goes low, and select signals S$_1$* is high. The low select signal S$_1$'* is inverted to wordline 14 through activated transistor 22. Although transistors 21 and 23 are deactivated the wordlines 12 and 16 remain at the initial low potential due to a latching of the low potential by the inverter/latch portion 11 of the driver circuits. Wordline 18 is driven low when the high potential of S$_1$* is driven through activated transistor 24 and inverted to wordline 18.

Figure 6:
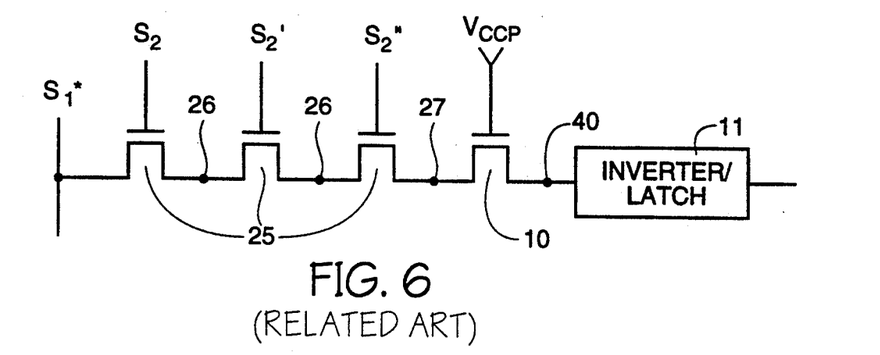
FIG. 6 is a schematic of a driver circuit of a row decoder of the related art.

FIG. 6 is exemplary of a driver portion of a row decoder circuit wherein the decode portion is implemented with tree decode circuitry having a plurality of pass transistors 25.

Serial nodes 26 and 27 tend to float to unknown potentials between cycles of cell selection. Since it is important to know the potential of serial nodes 26 and 27 the serial nodes 26 and 27 are typically reset to a known potential prior to the selection of the active wordline. During reset transistors 25 are actuated thereby precharging the serial nodes 26 and 27 to a high potential. Initial precharging presents a problem since there is a significant power consumption associated with precharging all of the serial nodes at the onset of each cycle.

In some circuits there have been problems with latch up. Latch up occurs when node 40 in FIGS. 4 and 6 has latched to the high supply potential through a transistor component (not shown) of the driver circuit. Latch up occurs when the potential of node 40 is greater than the supply potential, V$_{ccp}$. This can occur during power up when the supply potential is increasing. In order to eliminate latch up, a transistor device 10 is continually gated by a V$_{ccp}$ supply potential as shown in FIGS. 4 and 6. Transistor device 10 keeps the potential at node 40 less than the supply potential as long as the potentials at nodes 42 and 27 are less than the supply potential. Therefore, as long as the potentials at nodes 42 and 27 are less than V$_{ccp}$, the part will not latch up since the n-well of the transistor component of the driver circuit will never be forward biased. The function of the continually gated device will become clear when analyzed with respect to subsequent schematics of the present invention.

V$_{ccp}$ is a high voltage pump potential typically equal to the supply potential, V$_{cc}$, of the memory device plus a threshold voltage, V$_t$, of the access transistor, V$_{cc}$+V$_t$ equals V$_{ccp}$. The threshold voltage of the access transistor is the potential that must be overcome in order for the access transistor to conduct current.

In order to conserve power, supply potentials of many memory devices have been decreased from the typical 5 volt V$_{cc}$. A low supply voltage of 3.3 volts is increasingly replacing the 5 volt operation. There is a disadvantage associated with the lower supply potentials. Often the potentials driven to a node are marginal. They often do not meet the minimum low potentials for a high logic state. Thus, circuits can experience erroneous outputs potentials. For example, in FIG. 6 when the supply voltage is approximately 3 volts, the select signal on S$_1$* may be 3 volts. Considering that the NMOS transistor doesn't pass high potentials with minimal loss, we must expect a threshold voltage drop across the NMOS transistors 25. The input voltage to the inverter/latch 11, FIGS. 4-6, may drop from 3 volts to 2 volts due to the threshold loss. There exists the increased probability that the inverter/latch 11 will see the 2 volts as a low logic state rather than the high logic state desired, or that the threshold voltage loss will be greater thereby decreasing the potential at the input of the inverter/latch. A need therefore exists to provide a row decoder that consistently drives the wordline to the inactive low state for a high primary select signal regardless of the supply potential used. Therefore, memory device circuits need to be redesigned in order to successfully drive wordlines to low logic levels for circuits utilizing supply potentials less than the typical 5 volts.

Further understanding of the DRAM circuitry can be gleaned from the *DRAM DATA BOOK*, 1992, published by Micron Technology and herein incorporated by reference.

SUMMARY OF THE INVENTION

An object of the invention is a low power circuit and a method for quickly driving non-selected wordlines to correct potentials while providing a suitable row decode architecture for large memories and while providing reliable wordline selection for circuits utilizing supply potentials less than five volts.

The invention features a driving device which is directly actuated by a predecode signal. The wordline is driven through the actuated driving device to an inactive logic state. Typically the driving device is an NMOS transistor.

By directly gating the driving device error in wordline selection is eliminated. More particularly the invention eliminates the misfiring of a wordline to an active logic state as a result of the predecode signal experiencing V$_t$ losses prior to being inverted to the wordline as in the related art. Thus, wordlines of memory circuits utilizing supply potentials less than five volts are reliably driven to inactive logic states.

The invention also minimizes the delay time associated with the circuitry of the related art wherein the primary select signal is routed through at least one pass device before actuating a driving device. Since the circuitry of the invention eliminates the pass device of the related art delay time is eliminated and speed is increased. In addition power consumption is reduced by eliminating the need to actuate the pass device.

Details of the present invention will become clear from the following detailed description of the invention, taken in conjunction with the accompanying drawings.

DETAILED DESCRIPTION OF THE INVENTION

Figure 7:
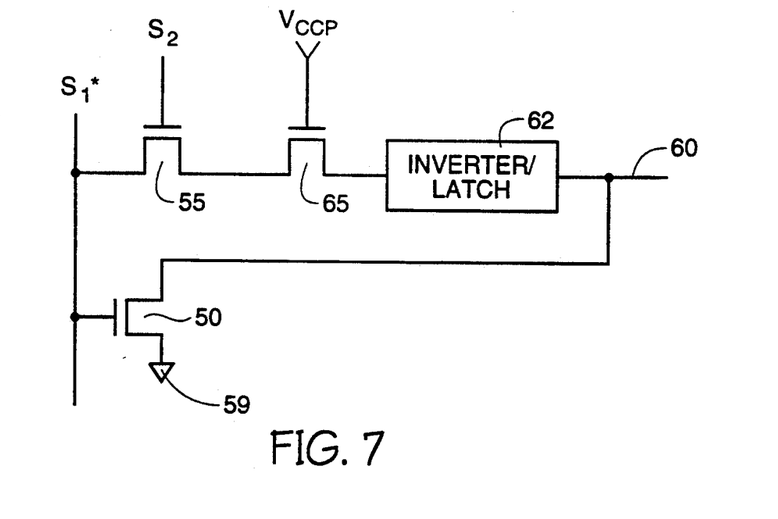
FIG. 7 is a simplified schematic of a driver circuit of the invention.

FIG. 7 represents a driver portion of a row decoder. A decode portion of the row decoder is not shown. The decode portion generates predecode signals $S_1^*$ and $S_2$. $S_1^*$ is a primary select signal and controls the actuation and deactuation of pull-down NMOS transistor 50. $S_2$ is a secondary select signal and controls the actuation and deactuation of pass NMOS transistor 55. When a high primary select signal actuates pull-down transistor 50, a low reference potential at reference node 59 is rapidly driven to the wordline 60 through the pull-down transistor 50. Since the high primary select signal is not driven through a pass transistor to the inverter/latch portion 62 and then inverted to the wordline, but instead directly drives the transistor that pulls the wordline low, there is a significant time savings realized over the circuit of the related art as shown in FIG. 4.

In a case where wordline 60 is selected the primary select signal $S_1^*$ goes to a low potential and the secondary select signal goes to a high potential. The low is then driven through transistors 55 and 65 to the input of inverter/latch 62 where the primary select signal is inverted and driven as a high potential to the wordline 60. The low primary select signal deacuates transistor 50 thereby isolating wordline 60 from the reference potential.

In the case where the primary select signal goes to a low potential but wordline 60 is not selected, the secondary select signal remains low, and the wordline is latched to its initial low potential by inverter/latch circuitry 62.

Figure 8:
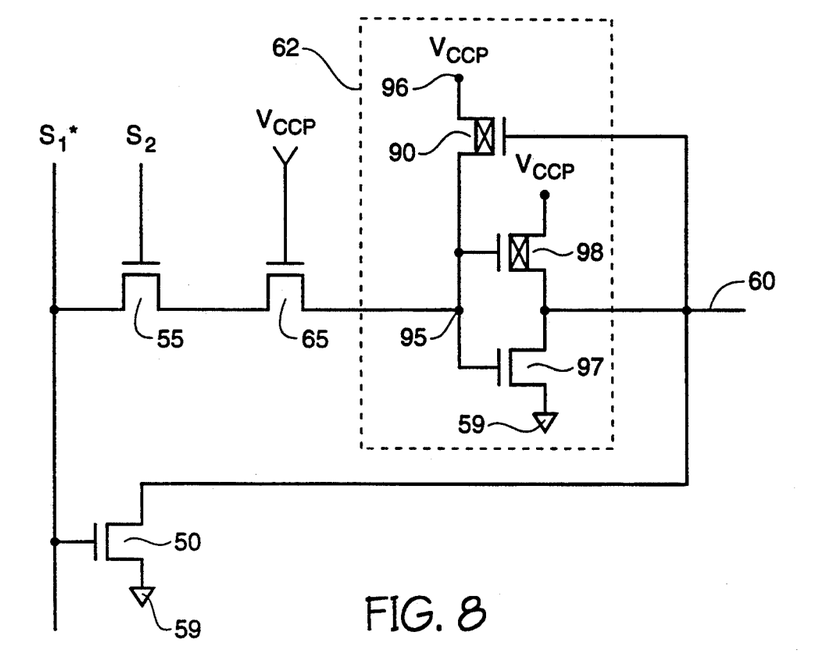
FIG. 8 is a detailed schematic of the driver circuit of the invention.

FIG. 8 is a more detailed schematic of the circuit of FIG. 7. A high primary select signal, $S_1^*$, gates transistor 50 rapidly pulling the wordline 60 to a low potential. The low on wordline 60 activates transistor 90 thereby pulling the gate node 95 to the high supply potential at high voltage node 96. This high supply potential at gate node 95 is actually a latch signal. The latch signal actuates transistor 97 which in turn pulls wordline 60 to the reference potential. Thus even if the primary select signal transitions low thereby deactuating transistor 50, the initial low potential on the inactive wordline is latched to the wordline by the inverter/latch circuitry, as long as transistor 55 remains deactuated.

In a case where wordline 60 is selected the primary select signal, $S_1^*$, transitions low and the secondary select signal, $S_2$, transitions high. The low primary select signal is then transmitted to node 95 through transistors 55 and 65. The low at 95 actuates transistor 98 and deactuates transistor 97 thereby pulling the wordline to a high supply potential and isolating the wordline from the reference potential.

In the circuit of FIG. 8 transistor 50 is relatively large when compared to transistor 97. Directly driving the wordline to the low potential through transistor 50 ensures the that the wordline is driven to the low potential quickly in the case where the supply potential is lower than the typical 5 volts. This is accomplished without the use of complicated PMOS circuitry and the more cumbersome layout methods necessitated in the manufacture of PMOS-NMOS circuits.

Continually gated NMOS transistor 65 is utilized to prevent the n-well of transistor 90 from forward biasing during powerup when $V_{ccp}$ is less than $V_{cc}$.

Figure 9:
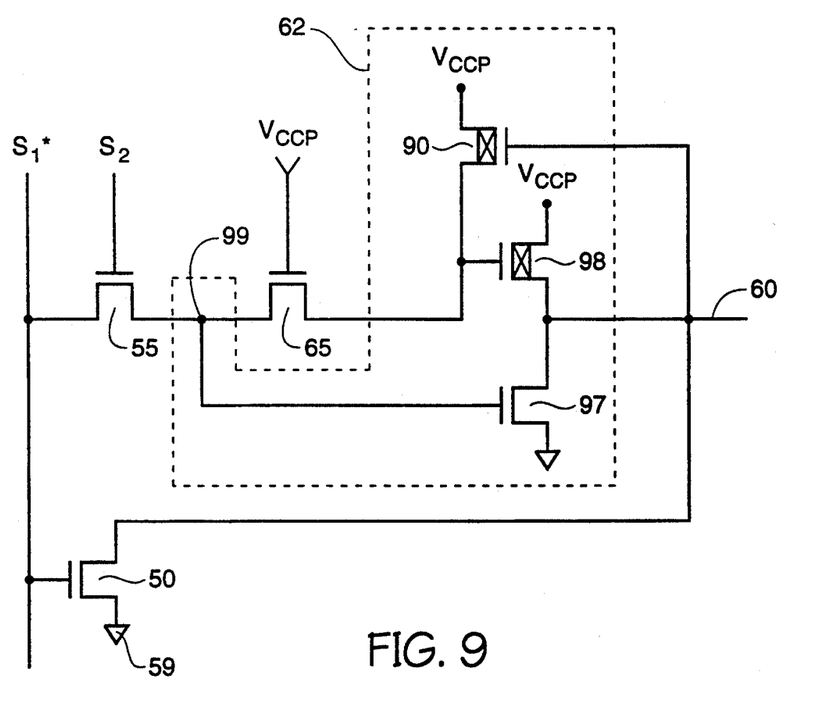
FIG. 9 is a detailed schematic of a further embodiment of the invention.

FIG. 9 is an alternate embodiment of the circuit of FIG. 8. In FIG. 9 the gate node 99 of transistor 97 is the serial connection of transistors 55 and 65. Both placements of nodes 95 and 99, as shown in FIGS. 8 and 9, are equally viable and the final configuration may well be determined from a manufacturing standpoint where layout design restrictions are weighted against circuit performance.

Figure 10:
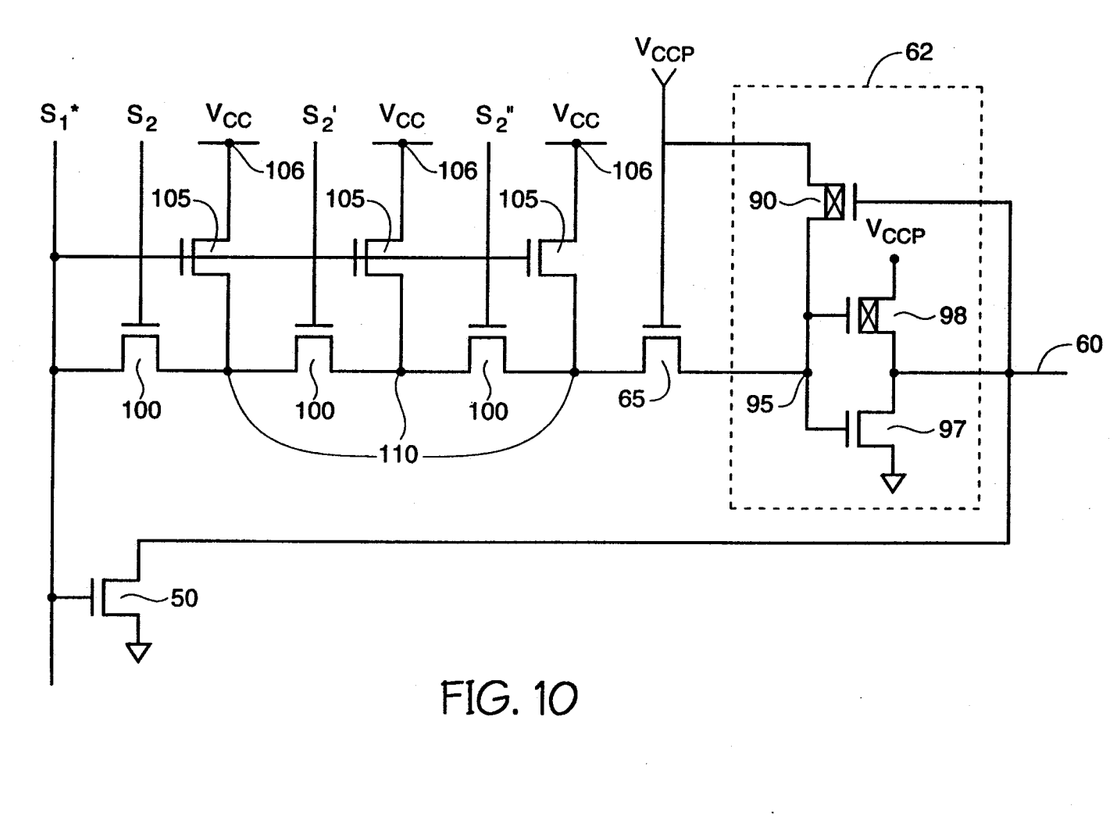
FIG. 10 is a detailed schematic of a further embodiment of the invention.

In FIG. 10 a tree decode is implemented as the decode portion of the row decoder. The circuit of FIG. 10 performs similar to the circuits of FIGS. 9 and 8. When the primary select signal $S_1^*$ is high transistor 50 is actuated and wordline 60 is pulled to the low reference potential. When the primary select signal transitions low the wordline is latched low by the inverter/latch circuit 62 in a case where the wordline is not selected. In this case at least one of the pass transistors 100 is deactuated. When wordline 60 is selected the secondary select signals $S_2$, $S_2'$, and $S_2''$ transition high thereby actuating pass transistors 100. The low primary select signal is then transmitted to node 95 and the primary select signal then actuates transistor 98 thereby pulling the wordline to the high supply potential. Transistors 50 and 97 are deacuated by the low primary select signal.

Serial nodes 110 provide the electrical connection between the pass transistors and between one of the pass transistors and the continually gated transistor 65. The automatic precharge circuit of the invention eliminates the need for the precharge circuit of the related art. The automatic precharge circuit of the invention provides quick response and large power saving without increasing cell size. The precharge circuit of the invention comprises the serial node pull-up transistors 105. Each serial node pull-up transistor 105 is interposed between high voltage node 106 connected to a supply potential, and a serial node 110. The serial node pull-up transistors are gated by a high primary select signal. Therefore when the primary select signal is high the serial node pull-up transistors are automatically actuated thereby automatically precharging the serial nodes by pulling them passively to the high potential.

When using the present invention the pass transistors 100 do not have to be actuated at the start of each cycle in order to precharge the nodes. A significant power savings is realized using the implementation of the invention over the previous implementation of the related art wherein all of the pass transistors were actuated before each cycle. Since the precharge occurs automatically the access speed is increased. The serial node pull up transistors are fabricated with existing silicon and there is no increase in cell size.

The automatic precharge circuit of the invention can also be utilized in a case wherein a MOS decode has been utilized. In this case the automatic precharge circuit is particularly useful during power up.

It can be seen that the invention quickly drives a nonselected wordline to an inactive logic state having a low potential through the pull-down transistor gated directly by the primary select signal. The low potential is latched to the wordline through an inverter/latch circuit which also drives the wordline to the low potential. The inverter/latch circuit drives a selected wordline high in response to a low primary select signal. Serial node charging transistors can be configured to automatically charge the serial nodes when the primary select signal is high thereby conserving power by eliminating the necessity of actuating all of the pass transistors for every wordline at the beginning of each cycle.

Although the invention has been described in terms of driving the potential of the wordlines of a DRAM to active and inactive potentials, the circuit has utility in other circuits where it is desired to quickly drive a node to a first potential and latch it to that first potential until a subsequent selection allows the circuitry to drive the node to a second potential. Modification to the circuitry may also be implemented without detracting from the concept of the invention. Accordingly, the invention should be read as limited only by the claims.

What is claimed is:

1. A memory device, comprising:
    a) an output node;
    b) decode circuitry for determining a logic state of said output node, said decode circuitry generating a primary and a secondary predecode signal;
    c) a driving circuit for driving the output node to an inactive logic state when actuated, said driving circuit directly actuated by a corresponding primary predecode signal;
    d) a latching circuit for monitoring the logic state of the output node and latching the output node to said inactive logic state;
    e) an inverter circuit for inverting said primary predecode signal to said output node; and
    f) a pass device for transmitting said primary predecode signal to said inverter when actuated by said secondary predecode signal, such that when said driving circuit is deactuated by said primary predecode signal and said pass device is actuated by said secondary predecode signal said wordline is driven to an active logic state.

2. A method for driving a wordline to a potential having an inactive logic state, the method comprising the following steps:
    a) generating a primary predecode signal having an actuation potential;
    b) actuating a driving device with said primary predecode signal having a full value of said actuation potential;
    c) driving the wordline to the potential having the inactive logic state through the driving device;
    d) generating a latch signal in response to the inactive logic state on the wordline, said latch signal having a potential capable of actuating latch circuitry;
    e) actuating said latch circuitry with said latch signal;
    f) latching the wordline to the inactive logic state through said latch circuitry;
    g) actuating a precharge device with said primary predecode signal having the full value of said actuation potential; and
    h) pulling a serial node to a precharge potential through said precharge device.

* * * * *